United States Patent
Wu et al.

(10) Patent No.: US 10,651,235 B1
(45) Date of Patent: May 12, 2020

(54) 2-TRANSISTOR 2-MAGNETIC TUNNEL JUNCTION (2T2MTJ) MRAM STRUCTURE

(71) Applicant: UNITED MICROELECTRONICS CORP., Hsin-Chu (TW)

(72) Inventors: Yi-Ting Wu, Tainan (TW); Jhen-Siang Wu, Kaohsiung (TW); Po-Chun Yang, Tainan (TW); Yung-Ching Hsieh, Tainan (TW); Zong-Sheng Zheng, Tainan (TW); Jian-Jhong Chen, Tainan (TW); Jen-Yu Wang, Tainan (TW); Cheng-Tung Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/296,225

(22) Filed: Mar. 8, 2019

(30) Foreign Application Priority Data

Feb. 18, 2019 (CN) .......................... 2019 1 0119591

(51) Int. Cl.
*H01L 27/22* (2006.01)
*G11C 11/16* (2006.01)
*H01L 43/08* (2006.01)

(52) U.S. Cl.
CPC ........ *H01L 27/228* (2013.01); *G11C 11/1655* (2013.01); *G11C 11/1675* (2013.01); *H01L 43/08* (2013.01)

(58) Field of Classification Search
CPC .......................... G11C 11/1655; G11C 11/1675
USPC ........................................................ 365/158
See application file for complete search history.

(56) References Cited

U.S. PATENT DOCUMENTS

| 10,134,459 B2* | 11/2018 | Toh ...................... G11C 11/1675 |
| 2005/0087785 A1* | 4/2005 | Lu ........................... B82Y 10/00 257/295 |
| 2009/0201717 A1* | 8/2009 | Maeda ................ G11C 11/1675 365/148 |
| 2012/0127786 A1* | 5/2012 | Amin ................... G11C 11/5607 365/158 |
| 2013/0058161 A1* | 3/2013 | Yamanaka .............. H01L 43/08 365/173 |
| 2013/0058162 A1* | 3/2013 | Yamanaka .............. H01L 43/08 365/173 |
| 2014/0264463 A1* | 9/2014 | Chou .................... H01L 27/228 257/252 |

(Continued)

FOREIGN PATENT DOCUMENTS

WO 2017176217 10/2017

*Primary Examiner* — Sung Il Cho
(74) *Attorney, Agent, or Firm* — Winston Hsu

(57) ABSTRACT

A first MRAM set includes a first transistor and a second transistor. The first transistor includes a first gate structure, a first source/drain doping region and a first common source/drain doping region. The second transistor includes a second gate structure, a second source/drain doping region and the first common source/drain doping region. A second MTJ is disposed on the second transistor. The first common source/drain doping region electrically connects to the second MTJ. A first MTJ is disposed on the first transistor. The sizes of the first MTJ and the second MTJ are different. The second MTJ connects to the first MTJ in series. A bit line electrically connects the first MTJ. A source line electrically connects to the first source/drain doping region and the second source/drain doping region.

13 Claims, 6 Drawing Sheets

(56) References Cited

U.S. PATENT DOCUMENTS

| | | | |
|---|---|---|---|
| 2015/0179244 A1* | 6/2015 | Seo | G11C 11/161 |
| | | | 365/158 |
| 2015/0357376 A1* | 12/2015 | Seo | H01L 27/228 |
| | | | 257/252 |
| 2016/0163254 A1* | 6/2016 | Lee | G06T 1/60 |
| | | | 345/545 |
| 2016/0254318 A1* | 9/2016 | Lu | G11C 11/1659 |
| | | | 257/421 |
| 2017/0092692 A1* | 3/2017 | Kalnitsky | H01L 43/12 |
| 2017/0160248 A1* | 6/2017 | Roizin | G01N 33/0027 |
| 2019/0066746 A1* | 2/2019 | Li | G11C 11/1659 |
| 2019/0206939 A1* | 7/2019 | Bozdag | H01L 43/02 |
| 2020/0013456 A1* | 1/2020 | Tzoufras | G11C 11/1675 |

* cited by examiner

First programming method

Second programming method

Third programming method

Fourth programming method

2-TRANSISTOR 2-MAGNETIC TUNNEL JUNCTION (2T2MTJ) MRAM STRUCTURE

BACKGROUND OF THE INVENTION

1. Field of the Invention

The present invention relates to an MRAM (magnetoresistive random access memory) structure, and more particularly to a 2T-2M (2-Transistor-2Memristor) MRAM structure.

2. Description of the Prior Art

Many modern day electronic devices contain electronic memory configured to store data. Electronic memory may be volatile memory or non-volatile memory. Volatile memory stores data only while it is powered, while non-volatile memory is able to store data even when power is removed. MRAM is one promising candidate for next generation non-volatile memory technology. An MRAM cell includes a magnetic tunnel junction (MTJ) having a variable resistance, located between two electrodes disposed within back-end-of-the-line (BEOL) metallization layers.

An MTJ generally includes a layered structure comprising a reference layer, a free layer and a tunnel oxide in between. The reference layer of magnetic material has a magnetic moment that always points in the same direction. The magnetic moment of the free layer is free, but is determined by the physical dimensions of the element. The magnetic moment of the free layer points in either of two directions: parallel or anti-parallel with the magnetization direction of the reference layer.

As dimensions of the MRAMs are scaled down, more digits are needed to be stored in a smaller area. An improved MRAM structure is therefore required in the field.

SUMMARY OF THE INVENTION

According to a preferred embodiment of the present invention, an MRAM structure includes a substrate. A first MRAM set is disposed on the substrate. The first MRAM set includes a first transistor disposed on the substrate, the first transistor comprising a first gate structure, a first source/drain doping region and a first common source/drain doping region. A second transistor is disposed on the substrate. The second transistor includes a second gate structure, a second source/drain doping region and the first common source/drain doping region. A second MTJ is disposed on the second transistor. The first common source/drain doping region electrically connects to the second MTJ. A first MTJ is disposed on the first transistor. The first MTJ and the second MTJ have different sizes or shapes, and the second MTJ connects to the first MTJ in series. A bit line is below the first MTJ and electrically connects to the first MTJ. A source line is below the bit line and the source line electrically connects to the first source/drain doping region and the second source/drain doping region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 to FIG. 9 depict four different programming methods of the first MRAM set, wherein:

FIG. 6 depicts a first programming method;
FIG. 7 depicts a second programming method;
FIG. 8 depicts a third programming method; and
FIG. 9 depicts a fourth programming method.

DETAILED DESCRIPTION

Figure 1:
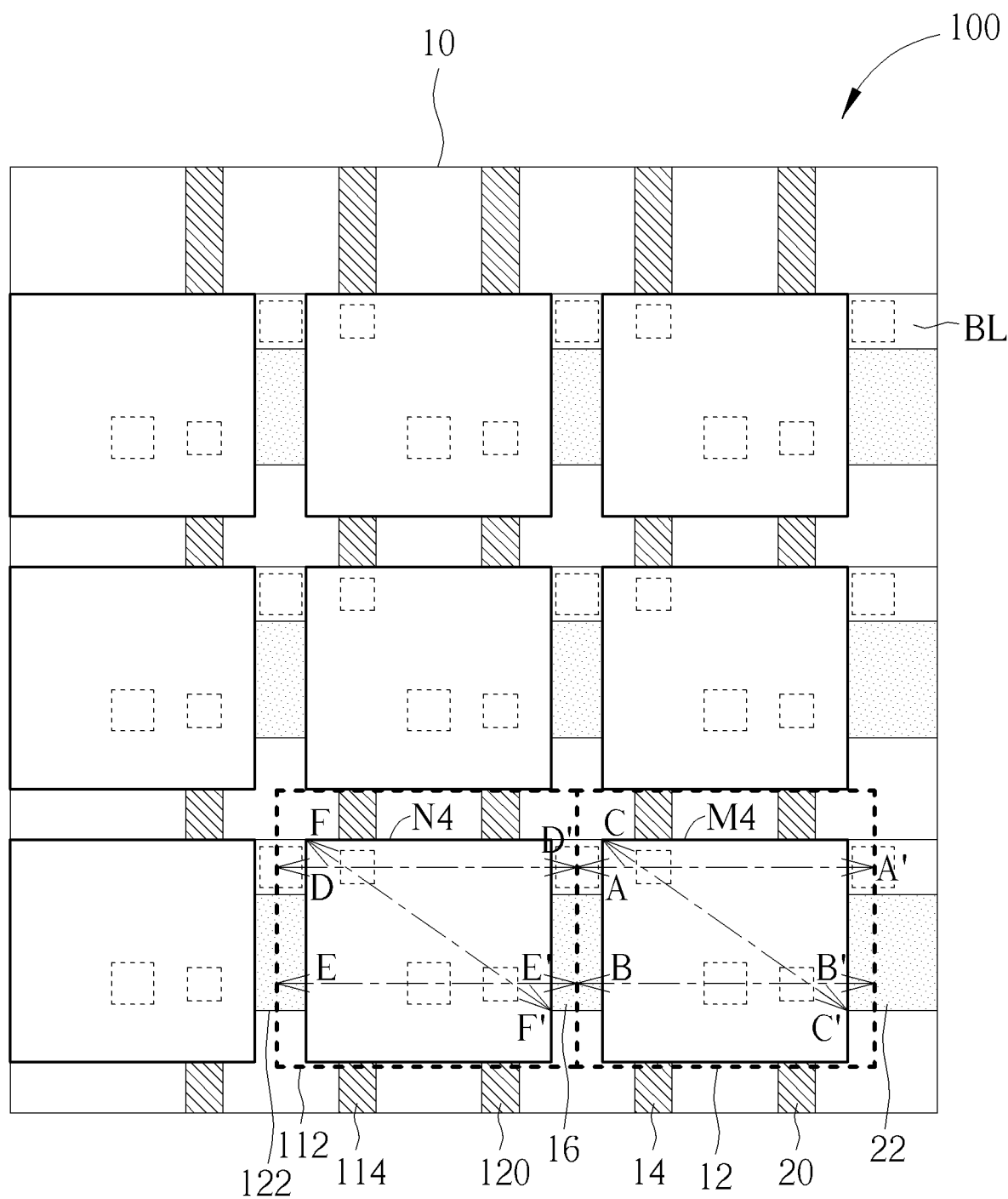
FIG. 1 depicts a top view of an MRAM structure according to a preferred embodiment of the present invention.
Figure 2:
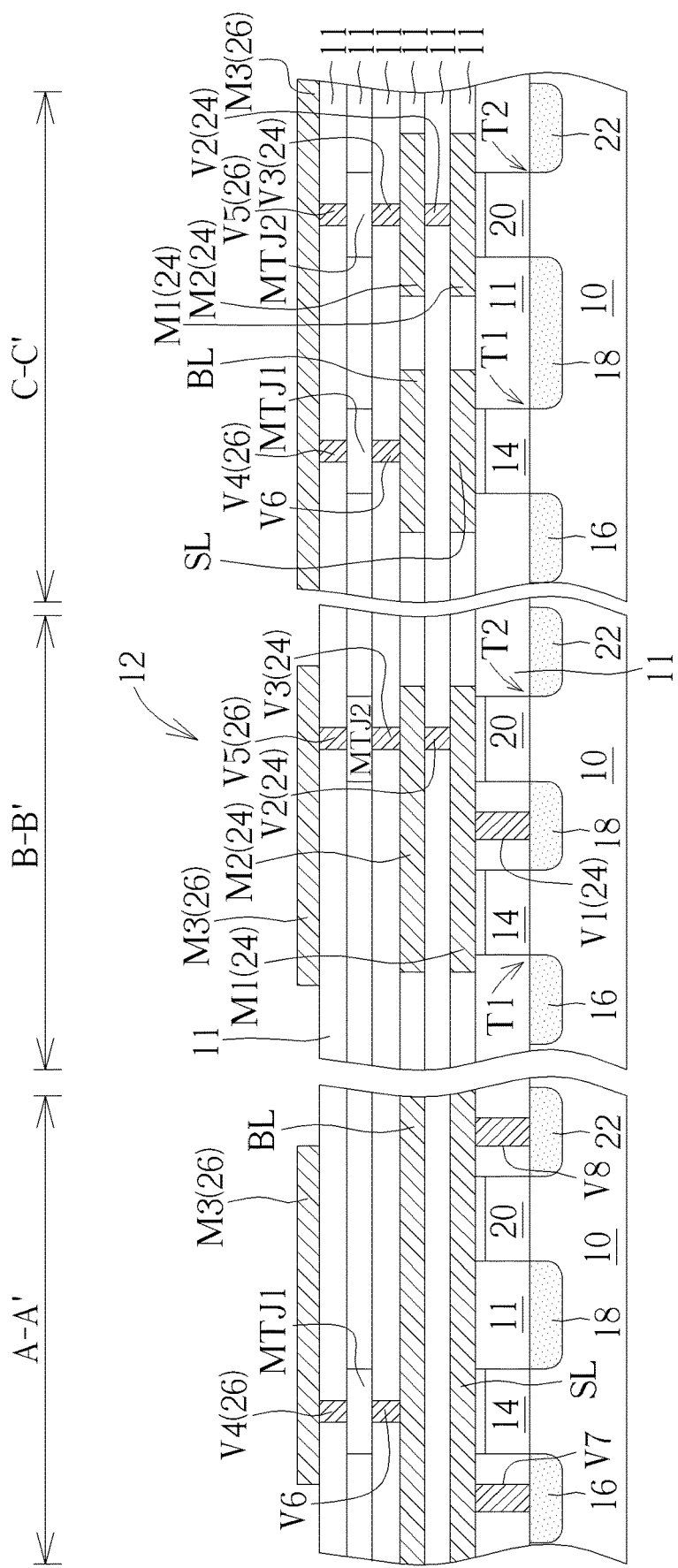
FIG. 2 depicts sectional views taken along line AA', line BB' and line CC' shown in FIG. 1.

FIG. 1 depicts a top view of an MRAM structure according to a preferred embodiment of the present invention. FIG. 2 depicts sectional views taken along line AA', line BB' and line CC' shown in FIG. 1.

As shown in FIG. 1, an MRAM structure 100 includes an MRAM array formed by numerous MRAM sets. The MRAM array includes numerous select gates, numerous bit lines, and numerous source lines disposed in a crisscross pattern on a substrate 10. The MRAM structure 100 includes a first MRAM set 12 and a second MRAM set 112. As shown in FIG. 2, the first MRAM set 12 is disposed on the substrate 10. The first MRAM set 12 includes a first transistor T1 and a second transistor T2 disposed on the substrate 10. The first transistor T1 includes a first gate structure 14, a first source/drain doping region 16 and a first common source/drain doping region 18. The second transistor T2 includes a second gate structure 20, a second source/drain doping region 22 and the first common source/drain doping region 18. The first transistor T1 and the second transistor T2 share the first common source/drain doping region 18.

A second MTJ (magnetic tunnel junction) MTJ2 is disposed directly on the second transistor T2, wherein the first common source/drain doping region 18 electrically connects to the second MTJ MTJ2 through the first metal line set 24. The first metal line set 24 is under the second MTJ MTJ2 and contacts the first common source/drain doping region 18 and the second MTJ MTJ2. In detail, the first metal line set 24 includes a conductive plug V1, a metal layer M1, a conductive plug V2, a metal layer M2 and a conductive plug V3. The conductive plug V1 contacts the first common source/drain doping region 18. The conductive plug V3 contacts an end of the second MTJ MTJ2. The first common source/drain doping region 18 is disposed within the substrate 10 between the first gate structure 14 and the second gate structure 20.

A first MTJ MTJ1 is disposed directly on the first transistor T1. A second metal line set 26 is disposed on the first MTJ MTJ1 and the second MTJ MTJ2, and contacts the first MTJ MTJ1 and the second MTJ MTJ2. In detail, the second metal line set 26 includes a conductive plug V4, a conductive plug V5, and a metal layer M3. The conductive plug V4 contacts the first MTJ MTJ1. The conductive plug V5 contacts the second MTJ MTJ2. The metal layer M3 is disposed on the conductive plug V4 and the conductive plug V5 and contacts the conductive plug V4 and the conductive plug V5. A bit line BL is disposed under the first MTJ MTJ1. The first MTJ MTJ1 electrically connects to the bit line BL through a conductive plug V6. A source line SL is disposed below the bit line BL. The source line SL electrically connects to the first source/drain doping region 16 through the conductive plug V7, and electrically connects to the second source/drain doping region 22 through the conductive plug V8. Moreover, the bit line BL and the source line SL entirely overlap as seen from a top view. The first MTJ MTJ1 overlaps the bit line BL as seen from a top view. Furthermore, a dielectric layer 11 is disposed between all the elements.

Figure 3:
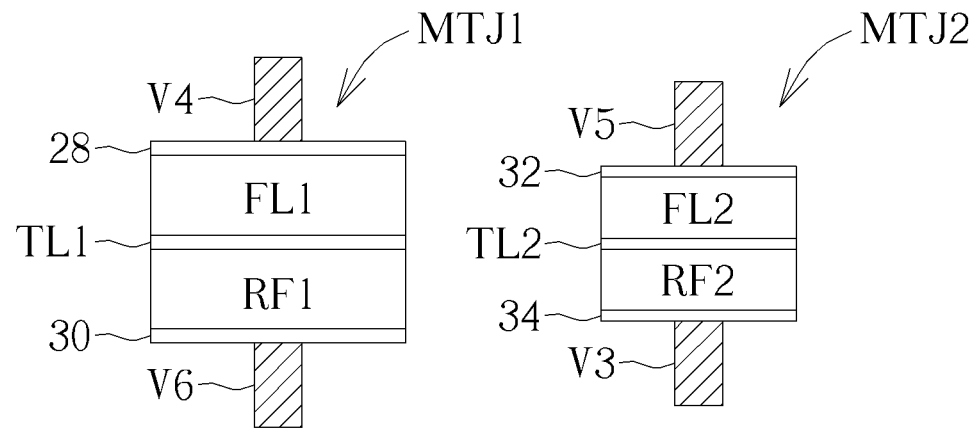
FIG. 3 depicts a magnified view of a first MTJ and a second MTJ.

FIG. 3 depicts a magnified view of the first MTJ and the second MTJ. As shown in FIG. 2 and FIG. 3, the first MTJ MTJ1 includes a first free layer FL1, a first reference layer RF1 and a first tunnel oxide TL1 disposed between the first free layer FL1 and the first reference layer RF1. The second MTJ MTHJ2 includes a second free layer FL2, a second reference layer RF2 and a second tunnel oxide TL2 disposed between the second free layer FL2 and the second reference layer RF2. The first free layer FL1 is farther from the substrate 10 than the first reference layer RF1, and the second free layer FL2 is farther from the substrate 10 than the second reference layer RF2. The first MTJ MTJ1 further includes a first top electrode 28 contacting the first free layer FL1. The first bottom electrode 30 contacts the first reference layer RF1. The first top electrode 28 contacts the conductive plug V4. The first bottom electrode 30 contacts the conductive plug V6. The second MTJ MTJ2 further includes a second top electrode 32 contacting the second free layer FL2. The second bottom electrode 34 contacts the second reference layer RF2. The second top electrode 32 contacts the conductive plug V5. The second bottom electrode 34 contacts the conductive plug V3. The directions of the magnetic moments of the first free layer FL1 and the second free layer FL2 respectively change according to changes in the direction and magnitude of current flowing through the first MTJ MTJ1 and the second MTJ MTJ2. The directions of the magnetic moments of the first reference RF1 and the second reference RF2 are fixed.

It is noteworthy that the first MTJ MTJ1 and the second MTJ MTJ2 have different sizes or shapes. FIG. 3 takes the first MTJ MTJ1 and the second MTJ MTJ2 having different sizes as an example. Accordingly, the sizes of the first free layer FL1 and the second free layer FL2 are different. Therefore, the respective current magnitude required to change the direction of the magnetic moments of the first free layer FL1 and the second free layer FL2 is different.

Figure 4:
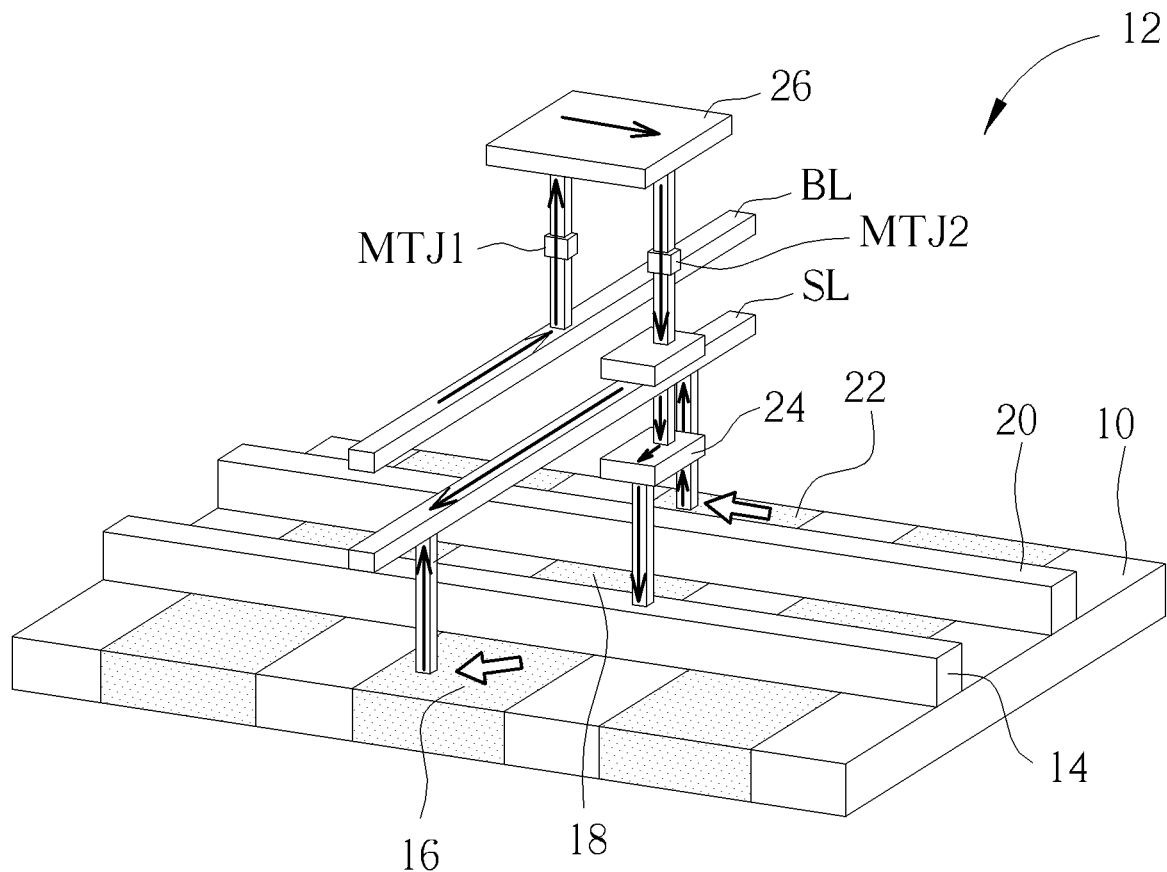
FIG. 4 depicts a three-dimensional diagram of a first MRAM set.

FIG. 4 depicts a three-dimensional diagram of the first MRAM set. For the sake of clarity, the dielectric layer 11 is omitted. As shown in FIG. 4, when a writing method is applied to write to the first MRAM set 12, a current (marked by arrows) flows in sequence into the bit line BL, the first MTJ MTJ1, the second metal line set 26, the second MTJ MTJ2, and the first metal line set 24 to reach the first common source/drain doping region 18. Then, the current is separated to flow in two directions. In one of the two directions, the current flows through the substrate 10 under the first gate structure 14 to reach the first source/drain doping region 16. In the other of the two directions, the current flows through the substrate 10 under the second gate structure 20 to reach the second source/drain doping region 22. Finally, the current in both directions flows to the source line SL. When another writing method is applied to write to the first MRAM set 12, the direction of the current is opposite to that of the writing method mentioned above, i.e. a current flows into the source line SL. The current is then separated to flow in two directions. In one of the two directions, the current flows through the first source/drain doping region 16 to reach the substrate 10 under the first gate structure 14. In the other of the two directions, the current flows to the second source/drain doping region 22 to the substrate 10 under the second gate structure 20. Later, the current in both directions is combined to flow through the first metal line set 24, the second MTJ MTJ2, the second MTJ MTJ2 to reach the bit line BL. In FIG. 4, the arrows only mark the current flowing from the bit line BL to the source line SL. The current flowing from source line SL to the bit line BL can be visualized by reversing the arrows.

Figure 5:
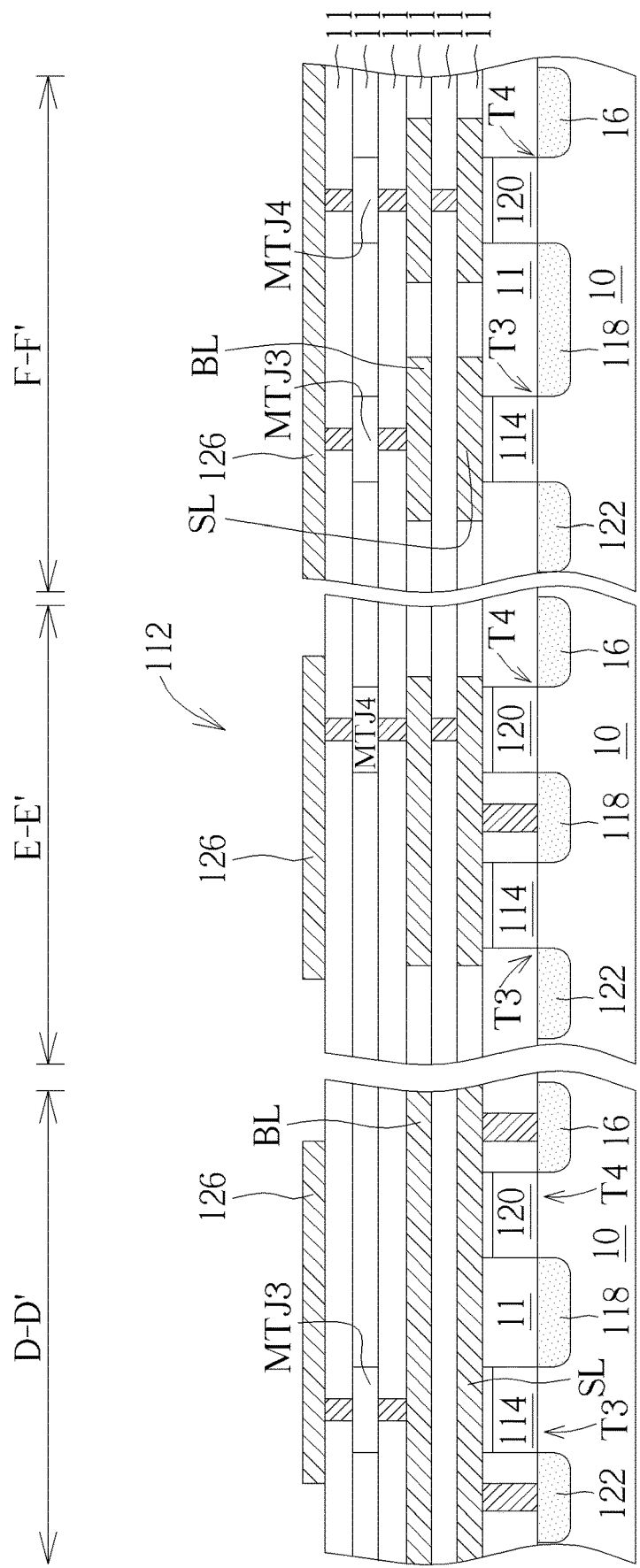
FIG. 5 depicts sectional views taken along line DD', line EE' and line FF' shown in FIG. 1.

FIG. 5 depicts sectional views taken along line DD', line EE' and line FF' shown in FIG. 1.

As shown in FIG. 1 and FIG. 5, a second MRAM set 112 is disposed on the substrate 10 at a side of the first MRAM set 12. The second MRAM set 112 includes a third transistor T3 and a fourth transistor T4 disposed on the substrate 10. The third transistor T3 includes a third gate structure 114, a third source/drain doping region 122 and a second common source/drain doping region 118. The fourth transistor T4 includes a fourth gate structure 120, the first source/drain doping region 16 and the second common source/drain doping region 118. The third transistor T3 and the fourth transistor T4 share the second common source/drain doping region 118. The first transistor T1 and the fourth transistor T4 share the first common source/drain doping region 16. A fourth MTJ MTJ4 is disposed directly on the third transistor T3. The second common source/drain doping region 118 electrically connects to the fourth MTJ MTJ4 through a third metal line set 124. A third MTJ MTJ3 is disposed on the third transistor T3. A fourth metal line set 126 is disposed on the third MTJ MTJ3 and the fourth MTJ MTJ4, and contacts the third MTJ MTJ3 and the fourth MTJ MTJ4. The structure of the second MRAM set 112 is the same as that of the first MRAM set 12. Similar to the second metal line set 26, the fourth metal line set 126 also has numerous metal layers and contact plugs. Similar to the first metal line set 24, the third metal line set 124 also has numerous metal layers and contact plugs. Refer to the first metal line set 24 and the second metal line set 26 for the detailed structure of the third metal line set 124 and the fourth metal line set 126.

The bit line BL is disposed under the third MTJ MTJ3. The third MTJ MTJ3 electrically connects to the bit line BL. The source line SL electrically connects to the third source/drain doping region 122 and the first common source/drain doping region 16. The second gate structure 20, the first gate structure 14, the fourth gate structure 120 and the third gate structure 114 are arranged from right to left.

The structure of the third MTJ MTJ3 is the same as the structure of the first MTJ MTJ1. The structure of the fourth MTJ MTJ4 is the same as the structure of the second MTJ MTJ2. The third MTJ MTJ3 and the fourth MTJ MTJ4 are different in sizes or shapes. Refer to FIG. 3 for illustrations of the structures of the third MTJ MTJ3 and the fourth MTJ MTJ4. The current direction of the second MRAM set 112 is the same as that of the first MRAM set 12. Refer to FIG. 5 for an illustration of the current direction of the second MRAM set 112.

FIG. 6 to FIG. 9 depict four different programming methods of the first MRAM set. The following description of the programming methods will take the first MRAM set 12 as an example. It should be noted, however, that the MRAM sets in the MRAM array can be operated by the same method. Because the shapes or the sizes of the first MTJ MTJ1 and the second MTJ MTJ2 are different, the respective current magnitude used to change the direction of the magnetic moment of the first MTJ MTJ1 and the second MTJ MTJ2 is different. By changing the direction of the magnetic moment, the first MTJ MTJ1 and the second MTJ MTJ2 can be individually transformed into a high resistance state or a low resistance state. Assuming the magnetic moment of the first MTJ MTJ1 is higher than that of the second MTJ MTJ2, a first current is used to transform the first MTJ MTJ1 into a high resistance state, a second current is used to transform the first MTJ MTJ1 into a low resistance state, a third current is used to transform the second MTJ MTJ2 into a high resistance state, and a fourth current is used to transform the second MTJ MTJ2 into a low resistance state, wherein the first current is higher than the second current, the second current is higher than the third current, and the third current is higher than the fourth current.

Figure 6:
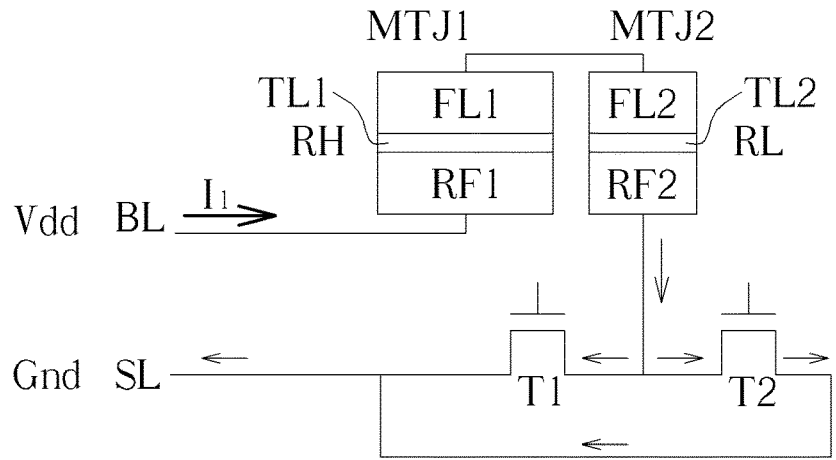

As shown in FIG. 6, a first programming method is performed to transform the first MRAM set 12 into a first logic type. The first logic type includes the first MTJ MTJ1 at a high resistance state RH while the second MTJ MTJ2 is at a low resistance state RL. The first programming method includes applying a voltage Vdd to the bit line BL; the source line SL is at a grounded voltage Gnd. Then, a first writing current $I_1$ flows into the bit line BL, the first reference layer RF1, the first tunnel oxide TL1, the first free layer FL1, the second free layer FL2, the second tunnel oxide TL2, the second reference layer RF2 and the source line SL in sequence. The first writing current $I_1$ is higher than the first current. For example, when the first current is 8 amperes, the second current is 4 amperes, the third current is 2 amperes and the fourth current is 1 ampere. The first writing current $I_1$ is higher than 8 amperes.

Figure 7:
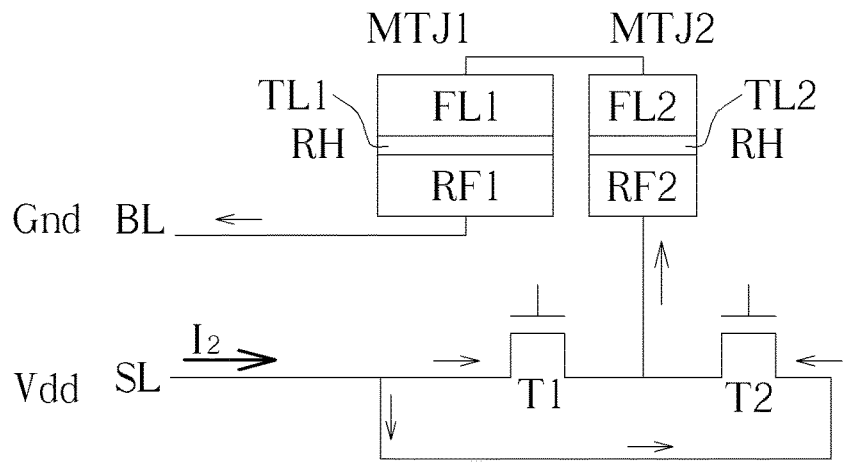

As shown in FIG. 7, a second programming method is performed to transform the first MRAM set 12 into a second logic type. The second logic type includes the first MTJ MTJ1 at a high resistance state RH while the second MTJ MTJ2 is also at a high resistance state RH. The second programming method includes performing the first programming method first. Later, a voltage Vdd is applied to the source line SL; the bit line BL is at a grounded voltage Gnd. Then, a second writing current $I_2$ flows into the source line SL, the second reference layer RF2, the second tunnel oxide TL2, the second free layer FL2, the first free layer FL1, the first tunnel oxide TL1 the first reference layer RF1 and the bit line BL in sequence. The second writing current $I_2$ is lower than the second current and higher than the third current. For example, when the first current is 8 amperes, the second current is 4 amperes, the third current is 2 amperes and the fourth current is 1 ampere. The second writing current $I_2$ is higher than 2 amperes and lower than 4 amperes.

Figure 8:
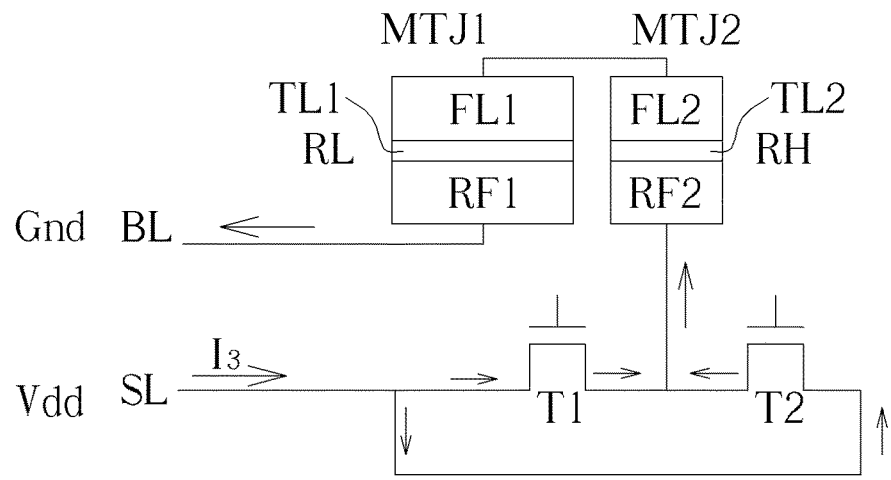

As shown in FIG. 8, a third programming method is performed to transform the first MRAM set 12 into a third logic type. The third logic type includes the first MTJ MTJ1 at a low resistance state RL while the second MTJ MTJ2 is at a high resistance state RH. The third programming method includes applying a voltage Vdd to the source line SL; the bit line BL is at a grounded voltage Gnd. Then, a third writing current $I_3$ flows into the source line SL, the second reference layer RF2, the second tunnel oxide TL2, the second free layer FL2, the first free layer FL1, the first tunnel oxide TL1, the first reference layer RF1 and the bit line BL in sequence. The third writing current $I_3$ is higher than the second current. For example, when the first current is 8 amperes, the second current is 4 amperes, the third current is 2 amperes and the fourth current is 1 ampere. The third writing current $I_3$ is higher than 4 amperes.

Figure 9:
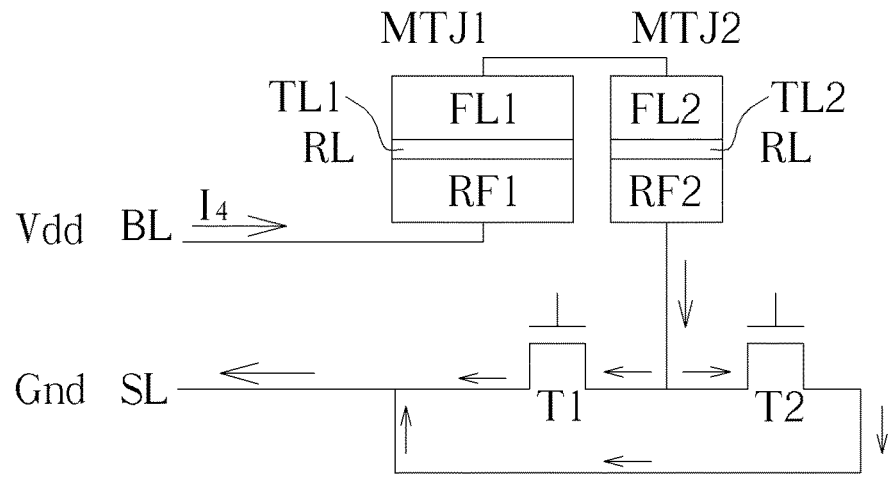

As shown in FIG. 9, a fourth programming method is performed to transform the first MRAM set 12 into a fourth logic type. The fourth logic type includes the first MTJ MTJ1 at a low resistance state RL while the second MTJ MTJ2 is also at a low resistance state RL. The fourth programming method includes performing the third programming method first. Later, a voltage Vdd is applied to the bit line BL; the source line SL is at a grounded voltage Gnd. Then, a fourth writing current $I_4$ flows into the bit line BL, the first reference layer RF1, the first tunnel oxide TL1, the first free layer FL1, the second free layer FL2, the second tunnel oxide TL2, the second reference layer RF2 and the source line SL in sequence. The fourth writing current $I_4$ is higher than the fourth current and lower than the first current. For example, when the first current is 8 amperes, the second current is 4 amperes, the third current is 2 amperes and the fourth current is 1 ampere. The fourth writing current $I_4$ is higher than 1 ampere and lower than 8 amperes. The abovementioned current values are only examples of the present invention; the value of the first current, the second current, the third current and the fourth current can be adjusted based on different requirements.

According to the present invention, information can be stored as a digital "1" or a "0" based on whether the first MTJ has a high resistance state or a low resistance state. Similarly, information can be stored as a digital "1" or a "0" based on whether the second MTJ has a high resistance state or a low resistance state. Therefore, the first MRAM set of the present invention is binary digits. By using the four programming methods, the first MRAM set can be turned into four logic types. Each of the four logic types has a corresponding resistance. During a reading step, the logic type of the first MRAM set can be determined based on the resistance of the first MRAM set. Then, it can be determined whether the first MTJ and the second MTJ are under the high resistance state or the low resistance state. The digit (0 or 1) of the first MTJ can be decided according to its resistance state, and the digit of the second MTJ can be decided according to its resistance state.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An MRAM structure comprising:
   a substrate; and
   a first MRAM set disposed on the substrate, wherein the first MRAM set comprises:
      a first transistor disposed on the substrate, the first transistor comprising a first gate structure, a first source/drain doping region and a first common source/drain doping region;
      a second transistor disposed on the substrate, the second transistor comprising a second gate structure, a second source/drain doping region and the first common source/drain doping region;
      a second MTJ disposed on the second transistor, wherein the first common source/drain doping region electrically connects to the second MTJ;
      a first MTJ disposed on the first transistor, wherein the first MTJ and the second MTJ have different sizes or shapes, and the second MTJ connects to the first MTJ in series;
      a bit line below the first MTJ and electrically connecting to the first MTJ; and
      a source line below the bit line and the source line electrically connecting to the first source/drain doping region and the second source/drain doping region.

2. The MRAM structure of claim 1, further comprising:
   a first metal line set disposed under the second MTJ and contacting the first common source/drain doping region and the second MTJ; and
   a second metal line set disposed on the first MTJ and contacting the first MTJ and the second MTJ.

3. The MRAM structure of claim 1, further comprising a second MRAM set disposed on the substrate at a side of the first MRAM set, wherein the second MRAM set comprises:
- a third transistor disposed on the substrate, the third transistor comprising a third gate structure, a third source/drain doping region and a second common source/drain doping region;
- a fourth transistor disposed on the substrate, the fourth transistor comprising a fourth gate structure, the first source/drain doping region and the second common source/drain doping region;
- a fourth MTJ disposed on the fourth transistor, wherein the second common source/drain doping region electrically connects to the fourth MTJ; and
- a third MTJ disposed on the third transistor, wherein the third MTJ and the fourth MTJ have different sizes or shapes, and the third MTJ connects to the fourth MTJ in series;
- wherein the bit line is below the third MTJ and electrically connects to the third MTJ, and the source line electrically connects to the first source/drain doping region and the third source/drain doping region.

4. The MRAM structure of claim 3, wherein the second gate structure, the first gate structure, the fourth gate structure and the third gate structure are arranged from left to right.

5. The MRAM structure of claim 1, wherein the bit line and the source line are entirely overlapped from a top view.

6. The MRAM structure of claim 1, wherein the first MTJ overlaps the bit line from a top view.

7. The MRAM structure of claim 1, wherein the first common source/drain doping region are disposed in the substrate between the first gate structure and the second gate structure.

8. The MRAM structure of claim 1, wherein the first MTJ comprises a first free layer, a first reference layer and a first tunnel oxide disposed between the first free layer and the first reference layer, the second MTJ comprises a second free layer, a second reference layer and a second tunnel oxide disposed between the second free layer and the second reference layer, the first free layer is farther from the substrate than the first reference layer, and the second free layer is farther from the substrate than the second reference layer.

9. The MRAM structure of claim 8, wherein a first current is used to transform the first MTJ into a first high resistance state, a second current is used to transform the first MTJ into a first low resistance state, a third current is used to transform the second MTJ into a second high resistance state, a fourth current is used to transform the second MTJ into a second low resistance state, the first current is higher than the second current, the second current is higher than the third current, and the third current is higher than the fourth current.

10. The MRAM structure of claim 9, wherein a first programming method is performed to transform the first MRAM set into a first logic type, the first programming method comprising a first writing current flowing into the bit line, the first reference layer, the first free layer, the second free layer, the second reference layer and the source line in sequence, wherein the first writing current is higher than the first current.

11. The MRAM structure of claim 10, wherein a second programming method is performed to transform the first MRAM set into a second logic type, the second programming method comprising performing the first programming method followed by a second writing current flowing into the source line, the second reference layer, the second free layer, the first free layer, the first reference layer and the bit line in sequence, wherein the second writing current is lower than the second current and higher than the third current.

12. The MRAM structure of claim 9, wherein a third programming method is performed to transform the first MRAM set into a third logic type, the third programming method comprising a third writing current flowing into the source line, the second reference layer, the second free layer, the first free layer, the first reference layer and the bit line in sequence, wherein the third writing current is higher than the second current.

13. The MRAM structure of claim 12, wherein a fourth programming method is performed to transform the first MRAM set into a fourth logic type, the fourth programming method comprising performing the third programming method followed by a fourth writing current flowing into the bit line, the first reference layer, the first free layer, the second free layer, the second reference layer and the source line in sequence, wherein the fourth writing current is higher than the fourth current and lower than the first current.

* * * * *